(12) United States Patent
Meier et al.

(10) Patent No.: US 9,147,346 B2
(45) Date of Patent: Sep. 29, 2015

(54) PROCESS AND SYSTEM FOR DETECTING A PARTICULAR STATE OF A SPECIFIC PARKING SPACE

(75) Inventors: Roger Meier, Lausanne (CH); Pierre Castella, Bulle (CH)

(73) Assignee: TINYNODE S.A., Lausanne (CH)

( * ) Notice: Subject to any disclaimer, the term of this patent is extended or adjusted under 35 U.S.C. 154(b) by 79 days.

(21) Appl. No.: 14/002,048

(22) PCT Filed: Feb. 6, 2012

(86) PCT No.: PCT/EP2012/051932
§ 371 (c)(1),
(2), (4) Date: Aug. 28, 2013

(87) PCT Pub. No.: WO2012/116874
PCT Pub. Date: Sep. 7, 2012

(65) Prior Publication Data
US 2013/0335240 A1    Dec. 19, 2013

(30) Foreign Application Priority Data
Feb. 28, 2011   (EP) .................................. 11156290

(51) Int. Cl.
*B60Q 1/48* (2006.01)
*G08G 1/14* (2006.01)
*G01S 17/02* (2006.01)
*G08G 1/042* (2006.01)
*G01R 33/10* (2006.01)
*G01V 3/08* (2006.01)

(52) U.S. Cl.
CPC *G08G 1/14* (2013.01); *G01R 33/10* (2013.01); *G01S 17/026* (2013.01); *G01V 3/081* (2013.01); *G08G 1/042* (2013.01); *G08G 1/146* (2013.01); *G08G 1/147* (2013.01)

(58) Field of Classification Search
CPC ......... G08G 1/14; G08G 1/042; G08G 1/146; G08G 1/147; G01R 33/10; G01S 17/026; G01V 3/081
USPC ....................................... 340/932.2
See application file for complete search history.

(56) References Cited

U.S. PATENT DOCUMENTS

| 5,544,041 | A  | * | 8/1996  | Nekomoto    | 705/1.1   |
|-----------|----|---|---------|-------------|-----------|
| 6,285,297 | B1 | * | 9/2001  | Ball        | 340/932.2 |
| 7,868,784 | B2 | * | 1/2011  | Kuo et al.  | 340/932.2 |
| 2002/0109610 | A1 | * | 8/2002  | Katz     | 340/932.2 |
| 2004/0222903 | A1 | * | 11/2004 | Li       | 340/932.2 |
| 2004/0252034 | A1 | * | 12/2004 | Slemmer et al. | 340/932.2 |

(Continued)

FOREIGN PATENT DOCUMENTS

EP   1 628 278          2/2006
WO   WO 2010033024 A1 *  3/2010

OTHER PUBLICATIONS

International Search Report issued in International Application No. PCT/EP2012/051932 dated Mar. 16, 2012.

*Primary Examiner* — Quang D Pham
(74) *Attorney, Agent, or Firm* — DLA Piper LLP US

(57) ABSTRACT

The present invention concerns a process and a system for detecting a particular state of a specific parking space among a plurality of parking spaces, a particular state being one of empty or occupied. Each parking space is equipped with at least one detector for measuring a value of at least one parameter, said parameter being variable according to the presence or absence of a vehicle.

13 Claims, 2 Drawing Sheets

(56) References Cited

U.S. PATENT DOCUMENTS

| | | |
|---|---|---|
| 2005/0096974 A1* | 5/2005 | Chagoly et al. .................. 705/13 |
| 2006/0033641 A1* | 2/2006 | Jaupitre et al. ............. 340/932.2 |
| 2006/0136131 A1* | 6/2006 | Dugan et al. ................... 701/300 |
| 2006/0170566 A1* | 8/2006 | Slemmer et al. ............ 340/932.2 |
| 2007/0050240 A1* | 3/2007 | Belani et al. .................... 705/13 |
| 2010/0214128 A1* | 8/2010 | Acharya et al. ............. 340/932.2 |
| 2010/0272317 A1* | 10/2010 | Riesco Prieto et al. ........ 382/105 |
| 2010/0309024 A1* | 12/2010 | Mimeault .................. 340/932.2 |
| 2011/0060653 A1* | 3/2011 | King et al. ................. 705/14.58 |
| 2011/0199077 A1* | 8/2011 | Bergstrom et al. ............ 324/244 |

\* cited by examiner

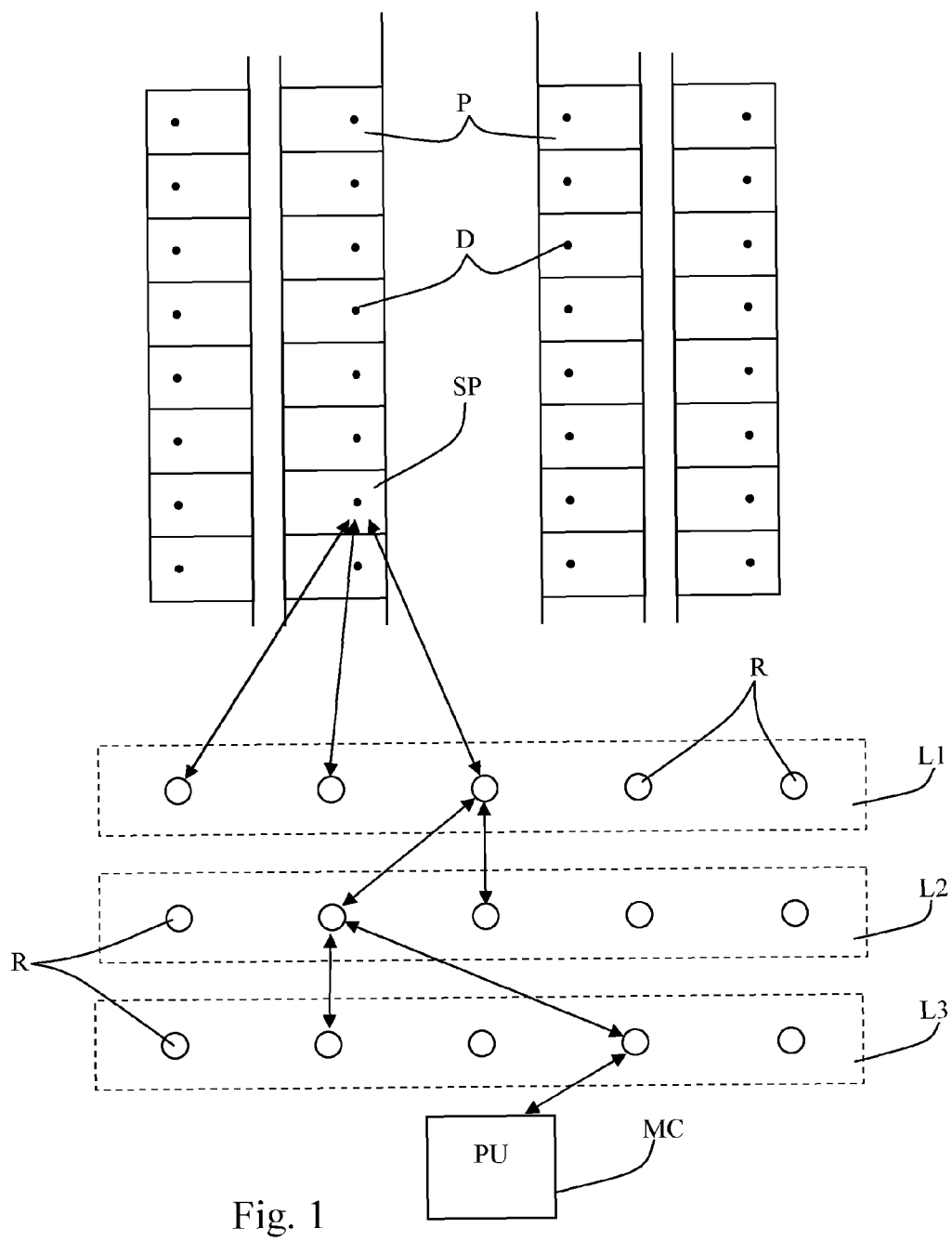
Fig. 1
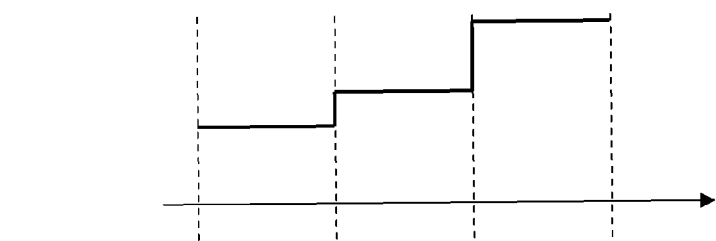
Fig. 3       0    0    1

PROCESS AND SYSTEM FOR DETECTING A PARTICULAR STATE OF A SPECIFIC PARKING SPACE

CROSS REFERENCE TO RELATED APPLICATIONS

This application is a U.S. National Stage Application of International Application No. PCT/EP2012/051932 filed Feb. 6, 2012, which claims priority from European Patent Application No. 11156290.6 filed Feb. 28, 2011. The entirety of all the above-listed applications are incorporated herein by reference.

TECHNICAL FIELD

The present invention concerns a process for detecting a particular state of a specific parking space among a plurality of parking spaces, a particular state being one of empty or occupied, each parking space being equipped with at least one detector for measuring a value of at least one parameter, said parameter being variable according to the presence or absence of a vehicle.

The present invention further concerns a system for detecting a particular state of a specific parking space among a plurality of parking spaces, a particular state being one of empty or occupied.

PRIOR ART

Nowadays, there are several systems enabling detecting if a parking space is occupied by a vehicle or if it is empty. In a great number of systems, each parking space is equipped with a detector measuring a parameter which varies according to the presence or absence of a vehicle in this space. One of the suitable types of detector is a magneto-resistive detector which measures the local deviations or modifications of the terrestrial magnetic field when a bulky metallic object is close to the detector. These detectors are interesting as they can be quite small, have relatively low power consumption and can be placed in a waterproof housing for outdoor installations in harsh environments.

Generally, these detectors comprise a radio emitter which transmits the value measured by the detector to a management center, possibly via one or several repeaters. The management center determines if the place is occupied or empty depending on the value received from the detector and on a comparison between this value and a reference value or a threshold corresponding to a known state.

The detectors that are used in this kind of application have different drawbacks. In particular, they are sensitive to several parameters which are difficult to control. For example, the temperature influences the measurement so that for a same intensity of the terrestrial magnetic field, the value measured is different whether it is cold or hot. Similarly, the detector suffers ageing which implies that identical variations of the magnetic field lead to different results over time. The terrestrial magnetic field itself has a very erratic behavior which makes the interpretation of the measurements quite difficult. Sporadic events such as for example the passage of a tram in close vicinity of the detectors may have a very strong influence on the measurements during a short period.

In order to minimize these problems, compensation mechanisms for the temperature and the ageing were developed. Calibration systems and procedures to compensate for the terrestrial magnetic field were also implemented. Strong perturbations during a short period are more difficult to compensate as they are unpredictable and as the intensity of the disturbance may have amplitude within the range of the variations due to the arrival of a car.

Despite of the corrections and calibration, with the compensation mechanisms currently used, the best detectors have a reliability of about 95%, which means that they make an error each 20 measures. This error can be the wrong detection of a vehicle on an empty space or on the contrary, the non detection of a vehicle on an occupied space. This error rate is quite high and penalizing for a commercially viable product.

Other existing detection systems do not measure a parameter, but rather detect if a signal is present or not. Such a system is in particular described in EP 1 628 278. In this system, three kinds of devices are used, namely emitter units, responder units and detector units. According to this system, an emitter unit emits a signal towards one or more responder units. In case a specific parking space corresponding to a specific responder unit is available, the responder unit sends a response towards one or more detector unit(s). If a vehicle is present in said specific parking space, no response will be detected by the detector unit. On the contrary, if no vehicle is in the specific parking space, the detector will receive the signal emitted by the response unit. The parking space will thus be considered as available.

This kind of systems does not deal with the issue of aging of the detectors. This means that if the characteristics of one emitter unit, one responder unit or one detector unit changes, the detection could be false for the corresponding parking space.

Each parking space or parking zone is provided with one response unit. The detector uses only the response or absence of response of one response unit to determine if the corresponding parking space or parking zone is available or not. The reliability of the system is therefore quite low and not better than conventional prior art systems. Moreover, if a response unit is unable to send a signal or if a detector is unable to detect a signal, for example due to a fault, the space will be considered as occupied and the fault will not be detected.

DISCLOSURE OF THE INVENTION

The present invention proposes to overcome the drawbacks of the systems of the prior art by providing a system which has a greater reliability than the prior art systems.

Moreover, in this system, the power consumption is reduced, which means that the lifespan of a detector is enhanced.

The object of the invention is obtained by a process as defined in the preamble, said process comprising the following steps:

measuring a first value of said at least one parameter with the detector for said specific parking space;

measuring a second value of said at least one parameter with the detector for at least one parking space close to said specific parking space wherein a parking space is considered as close to said specific parking space if the presence of a vehicle in said close parking space influences the value of the at least one parameter in a non negligible way in said specific parking space detector;

transmitting at least the first and second values to a processing unit;

comparing the first value with a memorized reference value corresponding to a known state of said specific parking space;

comparing at least the second value with the first value;

deciding whether the specific parking space has an occupied or empty state based on the result of both comparison steps.

The object of the invention is further obtained by a system as defined in the preamble, this system comprising:

for each parking space at least one detector intended for measuring a first value of at least one parameter, said parameter being variable according to the presence or absence of a vehicle;

transmission means for transmitting the measured value to a processing unit, this processing unit comprising means for comparing the first value with a stored reference value corresponding to a known state of the specific parking space;

means for comparing the first value with a second value of the parameter, measured for at least one parking space close to the specific parking space wherein a parking space is considered as close to said specific parking space if the presence of a vehicle in said close parking space influences the value of the at least one parameter in a non negligible way in said specific parking space detector, and;

means for determining the state of the parking space based on a comparison between on one hand the comparison between the first value and the stored reference value and on the other hand the second value.

In the present invention, the detectors are not considered as stand alone devices but as elements of a network. Each detector measures the value of at least one parameter which is influenced by the presence or absence of a vehicle on the considered space. According to a preferred embodiment, said parameter may vary continuously within a given range. This means that the parameter used may have more than two states such as "present" and "absent". The values of the parameter are then transmitted to a processing unit which receives the values measured by the other detectors. The decision to consider one specific parking space as empty or occupied depends not only on the value measured by the detector of said specific parking space but also on the values measured by detectors close to the considered parking space. Measuring the value of a parameter by several detectors and using the result of several detectors to decide if one specific parking space is empty or not enables taking into account various parameters which are difficult if not impossible to control. Moreover, it provides a convenient way of taking into account variations of parameters which can be measured, but which influences the result in a way which is difficult to predict. The parameters may vary depending on the age of the device, on the temperature or other climatic conditions for example. The variation of the terrestrial magnetic field is another example of variation which is difficult to predict. Sporadic disturbance can also be measured and the measurement can be used for corrections. Thanks to taking these parameters into account, the reliability of the system can reach up to 99%, which means that given 100 parking spaces, there is one wrong state reported in average.

In order to ensure a precise analysis of the measurements made by the detectors, the measurements are performed simultaneously. This enables allocating a short and precise time interval to make the measurements, to transmit the values of each detector to a repeater, then from the repeater to another repeater until the arrival at the processing unit.

Thus, each repeater "knows" at what time it will receive a message and at what time it must send a message. Outside these relatively short intervals, the detectors and repeaters can be placed in standby mode. This results in important energy savings and consequently, in a substantial increasing of the lifetime of the detectors and of the whole system.

The fact of considering these detectors as elements of a network and the fact of processing the measurements obtained by these detectors in a specific way enables obtaining an enhanced reliability and a reduced consumption.

SHORT DESCRIPTION OF THE DRAWINGS

The present invention and its advantages will be better understood with reference to the enclosed figures and thanks to a detailed description of a specific embodiment, wherein:

FIG. 1 schematically illustrates a car park equipped with a system according to the present invention;

FIG. 3 illustrates another specific measurement profile.

WAYS TO REALISE THE INVENTION

Figure 2A:
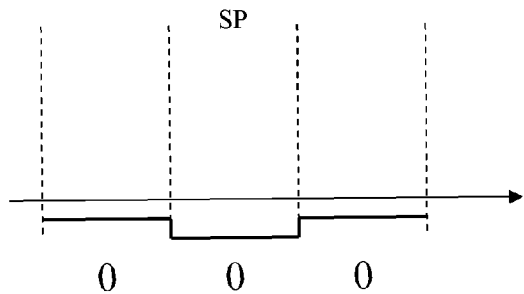
FIGS. 2a to 2f show several measurement profiles measured in several occupation configurations of a determined parking space.

FIG. 1 illustrates a car park that could be managed by the process of the invention. This car park comprises a plurality of parking spaces P, each parking space being equipped with at least one detector D. The following description concerns the case where one seeks to determine the presence or absence of a vehicle in a specific parking space noted SP on FIG. 1. In other words, one seeks to determine the empty or occupied state of the specific parking space.

According to the invention, several different kinds of detectors can be used, provided that this detector measures a parameter that varies according to the presence or absence of a vehicle close to that detector. It is also necessary that the detectors be associated individually with the parking spaces. As an example, a detector which is suitable for this application can be a detector which measures the terrestrial magnetic field or its variations. Hence, the terrestrial magnetic field is disturbed in close vicinity of an important metallic mass such as a vehicle. Moreover, these detectors can be of a relatively small size, so that they can be placed in a waterproof casing inserted in the coating of the parking space. These waterproof casings can moreover contain radio communication means and form a set which consumes relatively little energy. Thus, the lifetime can be quite long, typically from 5 to 10 years.

In a typical implementation, the car park comprises, in addition to the detectors for each parking space, a plurality of repeaters R and a management center MC comprising a processing unit PU.

According to an advantageous embodiment, each detector comprises means for emitting and receiving radio signals as well as a clock (not shown). They further comprise communication means for communicating with at least one repeater. The repeaters also comprise a clock and communication means which enable them to receive information from the detectors and to send information to the management center and/or to other repeaters.

According to a preferred implementation of the invention, the repeaters are distributed according to a predefined hierarchy formed, in the illustrated embodiment, of three levels. It should be understood that the number of levels can be different, without changing the way the invention works.

The repeaters of the first level L1 or at least a part of them are able to communicate directly with at least a part of the detectors D. Therefore, they are at a distance from the detectors which allows for such communication. The communication can be unidirectional, which means that the repeaters can receive messages from the detectors, but the communication from the repeaters towards the detectors is not possible. However, in a preferred embodiment, the communication can be bidirectional between the detectors and the repeaters.

The repeaters of the second level L2 are at least able to receive data from the first level's repeaters and to send data to the repeaters of the third level L3. According to an advantageous embodiment, the communications are bidirectional at each level, which means that for example the repeaters of the second level can send and receive data from the repeaters of the first level as well as of repeaters of the third level.

This feature is however not essential. The sole essential communication is the one which permits transmitting data from the detectors D to the processing unit PU.

It should be noted that it is not necessary for all the elements of one level to be able to communicate with all the elements of an adjacent level. Each detector can send data to a specific repeater or to one repeater amongst a set of repeaters. Similarly, each repeater can be considered as belonging to a given level in a first communication and to another level in another communication.

This modularity guarantees a great reliability to the system. Hence, if the communication between two entities is not possible, for example in case of breakdown, another communication path can be used.

It should be noted that, as the detectors usually have means for emitting said signals as well as means for receiving said signals, they can also play the role of the repeaters.

According to a preferred embodiment of the invention, each element works during a predefined time interval of a cycle. Herein, a cycle is defined as a duration which is sufficiently long to enable the detectors to make a measurement and to transmit this measurement to the processing unit, possibly through the repeaters. This cycle is split into several non-overlapping intervals. During each interval, a maximum of one type of operation is performed, as will be described below.

Each detector and each repeater have preferably a clock. Instead of or in addition to that clock, it is also possible for each element to comprise means for receiving a temporal reference which is common for all the elements, and means for counting the elapsed time with the possibility for triggering a specific action when the counter reaches a predefined value.

During a first interval I1 of a cycle, the detectors make a measurement of the variable parameter, for example the terrestrial magnetic field. This measurement can be a scalar or a vector value. For example, the magnetic field can be measured along three orthogonal axes, one of them being horizontal, in a direction in which a car would move when parking in the parking space.

When the first interval is over, the detectors stop taking measurements. A second interval I2 begins, the intervals being separated by a relatively short duration of inactivity. During this second interval, only the detectors and the first level repeaters are active. The detectors are in charge of sending the results of the measurements they performed during the first interval I1 and the first level repeaters are in charge of receiving the results of the measurements or messages containing these results of the measurements.

At the end of the interval I2, the detectors have finished with the transmission of the measurements and are set in standby mode. If a detector has not been able to end the transmission of the values measured, it nevertheless stops sending the message at the end of the second interval.

During a third time interval I3, also separated from the other ones, the first level repeaters transmit the messages they received from the detectors to the second level repeaters. Only the repeaters of the first and second levels are active, the other elements of the system are in standby mode.

The messages are transmitted from the second level's repeaters to the third level repeaters during a forth time interval I4 and then, from the third level's repeaters to the forth level repeaters during a fifth time interval I5.

This embodiment is particularly interesting due to the fact that each element is active only during a short part of the cycle. Thus an important power economy is realized, which enhances the life time consequently. Moreover, the fact that the detectors perform measurements simultaneously allows for the achievement for a particular processing of the data gathered, as is explained in detail below.

It should be noted that, depending on the size of the car park, the distribution of the parking spaces and of the processing means, the range of the detectors and of the repeaters, several levels of repeaters may be necessary. On the other hand, it is also possible that the detectors send the information directly to the processing unit, without requiring repeaters.

FIGS. 2a to 2f show the values that are measured for three adjacent parking spaces, according to different occupation configurations. In the following description, it is supposed that we seek to determine if the central parking space SP is occupied or empty. Each figure shows the value of the parameter measured by the detectors for the three parking spaces at a given time. The number 0 on the figures indicate that the parking space is empty. The number 1 indicates that the parking space is occupied.

According to the invention and contrary to the existing systems, the determination of whether a specific parking space is empty or not is not made only on the basis of the result of the measurements made by the detector on that specific parking space, but also on the basis of the measurements made by detectors close to the specific parking space. Herein, "close" means sufficiently close for the presence of a vehicle in one of said close parking space to influence the value of the parameter in a non negligible way on the specific parking space detector. The number and the positions of the detectors considered as close depends on the configuration of the car park area, of the sensitivity of the detectors and of the size of the vehicles (car, truck, . . . ) at least.

Figure 2D:
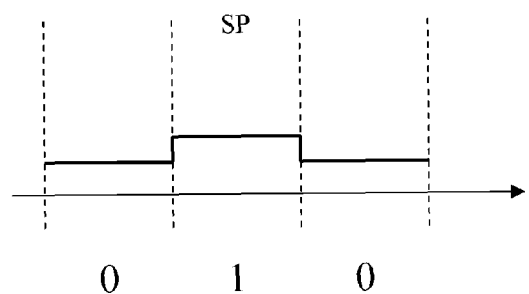
Figure 2B:
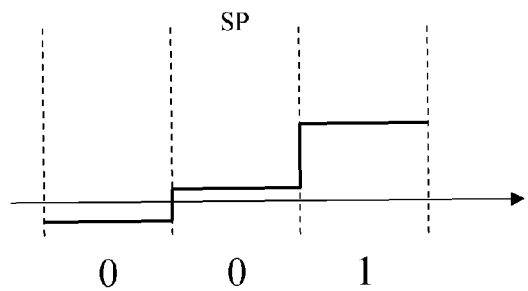
Figure 2E:
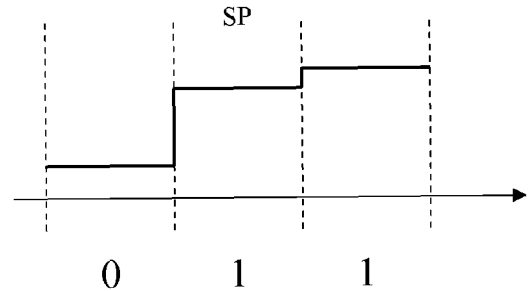
Figure 2C:
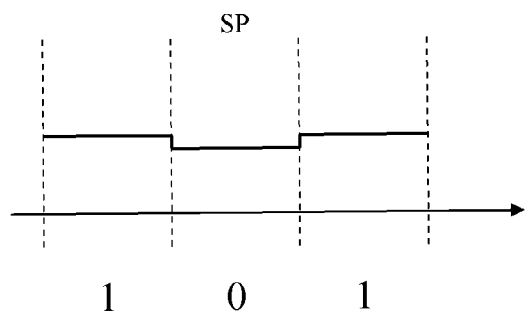

In the examples illustrated by FIGS. 2a, 2b and 2c, the specific parking space is empty. In the case of FIG. 2a, the specific parking space is surrounded by two empty spaces. In the example of FIG. 2b, the specific parking space is surrounded by one empty space and one occupied space. In the example of FIG. 2c, it is surrounded by two occupied spaces.

FIG. 2a, in which all three spaces are empty, shows that the value of the measured parameter is relatively low. The values for the three parking spaces are not necessarily equal. This can be due to local variations of the measured parameter, for example the terrestrial magnetic field, to different behaviors of the detectors (ageing, sensitivity, . . . ) or to disturbance due to close parking spaces for example.

In FIG. 2b, the specific parking space is empty as in the prior example, but it is adjacent to an occupied parking space. As can be seen, the value measured for the specific parking space is higher than in the case illustrated by FIG. 2a. Hence, the vehicle in the adjacent parking space influences the measure.

FIG. 2c illustrates a situation where the specific parking space is also empty, but it is surrounded by two occupied spaces. The value measured for the specific parking space is higher than in the two former cases because the vehicles in the adjacent spaces influence the measured value.

Figure 2F:
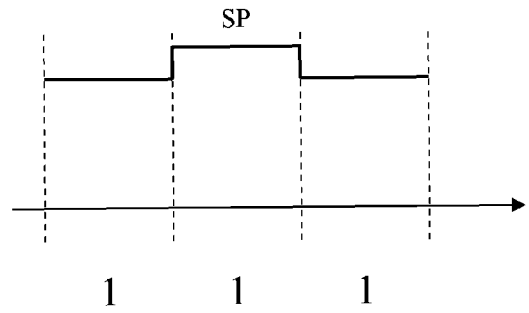

Similarly, FIGS. 2d, 2e and 2f represent configurations where the specific parking space SP is occupied. It is surrounded respectively by two empty spaces, by one empty space and one occupied space and finally, by two occupied spaces.

In FIG. 2d, the value measured by the detector of the specific parking space is relatively low. In FIG. 2e, this value is higher. This is due to the presence of a vehicle in a neighboring space, which influences the value measured by the detector for the specific parking space. In FIG. 2f, the value measured for the specific space is still higher, due to the presence of a vehicle in both neighboring spaces.

As it can be seen from these figures, it is possible that the value measured for an occupied space, for example the central parking space of FIG. 2d, is lower than the value measured for an empty space, for example the central space of FIG. 2c.

In the prior art systems, the following hypothesis is made: the value measured for an empty parking space is always lower than the value measured for an occupied parking space. Conversely, it is supposed that the value measured for an occupied space is always higher than the value measured for an empty space. In such a system, the situations illustrated by FIGS. 2c and 2d would lead to false detections.

In the present invention, a fist value of the parameter is measured with the detector for the specific parking space SP. This value is transmitted to the processing unit possibly through repeaters, as explained previously. A second value of the parameter is measured with the detector for at least one parking space close to the specific parking space. In the example of FIGS. 2a to 2f, the second valued is measured for two parking spaces adjacent to the specific parking space. The second values are also sent to the processing unit, possibly through repeaters.

The management center comprises memorized values corresponding to known states of the specific parking space and of close parking spaces. This processing unit compares the first value, i.e. the value obtained for the specific parking space, with a value memorized in the management center and corresponding to a known state of the specific parking space. It further compares the second values with memorized values corresponding to known states of the close parking spaces. Both comparisons are used to decide whether the specific parking space should be considered as empty or occupied.

The first and second values can be used to form a measurement profile which can be graphically represented as on FIG. 2a to 2f. This profile is compared in the processing unit with profiles corresponding to known states. The comparison with a known absolute value memorized in the management center can be used to discriminate between two ambiguous situations.

As can be understood, in the present invention, not only the absolute value of the parameter measured by a detector for a given parking space is taken into account, but also the values measured for the neighbor parking spaces. In the examples illustrated by FIG. 2a to 2f, if the measurements give a measurement profile similar to that illustrated by FIG. 2a, it could indicate a configuration wherein the three spaces are empty or a configuration wherein the central space is empty and both neighbor spaces are occupied. In both cases, the central space is empty. The absolute value of the measurement can ascertain that this deduction is correct.

In the case where the three spaces are empty, it is also possible to obtain a measurement profile similar to that of FIG. 2d, which represents a central occupied space surrounded by two empty spaces. This could be due to local disturbance of the measured parameter. In this case, the absolute value of the measurements enables discriminating between both situations.

A profile that could be obtained in case of local disturbance is illustrated by FIG. 3. Such a disturbance could arise for example when a tram passes close to the detectors. In such a case, the values measured increase dramatically for all the detectors. By using the measurements of only one detector and a fixed threshold, it is possible to consider all the spaces influenced by the tram as occupied. On the contrary, by taking into account a plurality of detectors, such a disturbance can be identified and the measurements can be corrected. The state occupied or empty of each parking space can thus be determined correctly even in case of strong disturbance affecting several detectors.

The advantage of the system of the present invention comes from the fact that the absolute values used to discriminate between two situations are not measured for a single space, but for several spaces. This enables taking into account parameters that the prior art systems neglect or are not able to control, such as for example important variations of the terrestrial magnetic field, independent of the presence of a vehicle or sporadic disturbance.

In the present invention, for each parking space, at least the following elements are taken into account: the configuration of the car park and the occupation of spaces around the specific parking space. This is possible thanks to the fact that the measurements made by the detectors are made simultaneously. The processing of these simultaneous measurements leads to a greater reliability of the system. Processing measurements that have been taken at different times will lead to more ambiguity in the interpretation and therefore to a less reliable system.

In the case where the parameters measured are vector values, the component according to each axis can be taken into account individually. Measurement profiles similar to those illustrated by FIG. 2a to 2f will result for each component. If three axes are used, comparisons for each like axial component will be made for the different measurements. For example, when a vehicle is in a specific parking space, the variation of the terrestrial magnetic field has a strong vertical component. When a vehicle is in an adjacent space, the variation will be directed towards the vehicle and will thus have a relatively small vertical component and a greater horizontal component. The analysis of these components further enhances the reliability as it enables differentiating the case where a vehicle parks in the specific parking space and the case where it parks in the adjacent space.

Detectors measuring two or more different parameters could also be used. An example of a first parameter could be the variation of the terrestrial magnetic field and the second parameter the reflection of a light by the bottom of the vehicle. Similarly, several detectors could be used for one parking space, these detectors measuring the same parameter or different parameters.

The invention claimed is:

1. A method for detecting a particular state of a specific parking space among a plurality of parking spaces, the particular state of the specific parking space being one of empty or occupied, each parking space being equipped with at least one detector for measuring a value of at least one parameter, said value being a magnetic field value, the at least one parameter being variable according to a presence or absence of a vehicle in the respective parking space, the method comprising steps of:

measuring, during a first time interval, a first value of the magnetic field with the at least one detector associated with the specific parking space;

measuring, during said first time interval, a second value of the magnetic field with the at least one detector associated with at least one parking space close to the specific parking space, wherein the at least one parking space is considered close to the specific parking space if a presence or absence of a vehicle in the close parking space influences the first value of the magnetic field in a non-negligible way;

transmitting at least the first and second magnetic field values to a processing unit of a management center;

comparing, by the processing unit of the management center, the first magnetic field value with a stored reference value corresponding to a known state of the specific parking space;

comparing at least the second magnetic field value with the first magnetic field value; and determining whether the specific parking space has an occupied or empty state, based on the result of both of said comparison steps.

2. The method for detecting the particular state according to claim 1, further comprising the steps of:

forming a measurement profile, the measurement profile comprising at least the first and second magnetic field values; and comparing the measurement profile with a set of measurement profiles stored in the management center and corresponding to a set of known states of the specific parking space and of the at least one close parking space.

3. The method for detecting the particular state according to claim 1, wherein the first magnetic field value and the second magnetic field value each comprise at least two axial components and the comparison steps comprise comparing axial components of the first magnetic field value with axial components of the second magnetic field value.

4. The method for detecting the particular state according to claim 1, wherein the first and second magnetic field values are transmitted towards the processing unit during a second time interval which does not overlap with the first time interval.

5. The method for detecting the particular state according to claim 1, wherein the first and second magnetic field values are transmitted to the processing unit through repeaters.

6. The method for detecting the particular state according to claim 5, wherein the repeaters transmit the received first and second magnetic field values during a third time interval which does not overlap with the second time interval.

7. A system for detecting a particular state of a specific parking space among a plurality of parking spaces, the particular state being one of empty or occupied, said system comprising:

a processing unit for a management center; and for each parking space, at least one detector configured to:
measure a value of at least one parameter, said value being a magnetic field value, the at least one parameter being variable according to a presence or absence of a vehicle in the respective parking space, wherein the at least one detector for the specific parking space is configured to measure, during a first time interval, a first magnetic field value of the at least one parameter for the specific parking space; and transmit the measured magnetic field value from each detector to the processing unit of the management center;

wherein the processing unit is configured to:

compare the first magnetic field value with a stored reference value corresponding to a known state of the specific parking space;

compare the first magnetic field value with a second value of the magnetic field of the at least one parameter measured, during the first time interval, for at least one parking space close to the specific parking space, wherein the at least one parking space is considered as close to the specific parking space if a presence or absence of a vehicle in the close parking space influences the first magnetic field value of the at least one parameter in a non-negligible way; and determine the particular state of the parking space based on the result of both of the comparison between the first magnetic field value and the stored reference value and the comparison between the first magnetic field value and the second magnetic field value.

8. The system for detecting the particular state according to claim 7, wherein each detector is configured to transmit the magnetic field value during a second time interval which does not overlap with the first time interval.

9. The system for detecting the particular state according to claim 8, further comprising repeaters configured to receive the magnetic field value transmitted by the detectors during the second time interval and to transfer the magnetic field value received from the detectors to the processing unit during a third time interval which does not overlap with the second time interval.

10. The system for detecting the particular state according to claim 9, wherein the repeaters comprise a clock.

11. The system for detecting the particular state according to claim 8 wherein each of the at least one detector comprises a clock.

12. The system for detecting the particular state according to claim 8 wherein each of the at least one detector comprises a receiver for receiving synchronization signals from the processing unit.

13. The system for detecting the particular state according to claim 10, wherein each repeater comprises a receiver for receiving synchronization signals from the processing unit.

* * * * *